United States Patent [19]

Horst

[11] Patent Number: 5,239,641
[45] Date of Patent: Aug. 24, 1993

[54] METHOD AND APPARATUS FOR SYNCHRONIZING A PLURALITY OF PROCESSORS

[75] Inventor: Robert W. Horst, Cupertino, Calif.

[73] Assignee: Tandem Computers Incorporated, Cupertino, Calif.

[21] Appl. No.: 657,990

[22] Filed: Feb. 20, 1991.

Related U.S. Application Data

[63] Continuation of Ser. No. 118,503, Nov. 9, 1987, abandoned.

[51] Int. Cl.5 .................................................. G06F 1/00
[52] U.S. Cl. ..................................................... 395/550
[58] Field of Search .............. 364/200, 900; 371/47.1, 371/61, 62

[56] References Cited

U.S. PATENT DOCUMENTS

| | | | |
|---|---|---|---|
| 3,602,900 | 8/1971 | Delaigue et al. | 340/172.5 |
| 3,681,578 | 8/1972 | Stevens | 235/153 |
| 3,735,356 | 5/1973 | Yates . | |
| 3,761,884 | 9/1973 | Avsan et al. . | |
| 3,810,119 | 5/1974 | Zieve et al. | 340/172.5 |
| 3,828,321 | 8/1974 | Wilber et al. | 340/172.5 |
| 3,833,798 | 9/1974 | Schaffer et al. | 235/153 |
| 3,848,116 | 11/1974 | Moder et al. | 235/153 |
| 3,921,149 | 11/1975 | Kreis et al. | 340/172.5 |
| 4,015,243 | 3/1977 | Kurpanek et al. | 340/172.5 |
| 4,015,246 | 3/1977 | Hopkins, Jr. et al. | 340/172.5 |
| 4,034,347 | 7/1977 | Probert, Jr. | 364/200 |
| 4,187,538 | 2/1980 | Douglas et al. | 364/200 |
| 4,224,664 | 9/1980 | Trinchieri | 364/200 |
| 4,228,496 | 10/1980 | Katzman et al. | 364/200 |
| 4,234,920 | 11/1980 | Van Ness et al. | 364/200 |
| 4,253,144 | 2/1981 | Bellamy et al. | 364/200 |
| 4,257,097 | 3/1981 | Moran | 364/200 |
| 4,315,310 | 2/1982 | Bayliss et al. | 364/200 |
| 4,316,245 | 2/1982 | Luu et al. | 364/200 |
| 4,321,666 | 3/1982 | Tasar et al. | 364/200 |
| 4,330,826 | 5/1982 | Whiteside et al. | 364/200 |
| 4,358,823 | 11/1982 | McDonald et al. | 364/200 |
| 4,366,535 | 12/1982 | Cedolin et al. | 364/200 |
| 4,375,683 | 3/1983 | Wensley | 371/36 |
| 4,380,046 | 4/1983 | Fung | 364/200 |

(List continued on next page.)

FOREIGN PATENT DOCUMENTS 0141246  9/1984  European Pat. Off. .

(List continued on next page.)

OTHER PUBLICATIONS

"Fault Tolerant Systems can Prevent Timing Problems" by John H. Wensley Computer Design, vol. 21 (1982) No. 11, Winchester, Mass.

(List continued on next page.)

*Primary Examiner*—Eugene R. LaRoche
*Assistant Examiner*—Christopher R. Glenbocki
*Attorney, Agent, or Firm*—Graham & James

[57] ABSTRACT

A method and apparatus for synchronizing a plurality of processors. Each processor runs off of its own independent clock, indicates the occurrence of a prescribed process or event on one line and receives signals on another line for initiating a processor wait state. Each processor has a counter which counts the number of processor events indicated since the last time the processors were synchronized. When an event requiring synchronization is detected by a sync logic circuit associated with the processor, the sync logic circuit generates the wait signal after the next processor event. A compare circuit associated with each processor then tests the other event counters in the system and determines whether its associated processor is behind the others. If so, the sync logic circuit removes the wait signal until the next processor event. The processor is finally stopped when its event counter matches the event counter for the fastest processor. At that time, all processors are synchronized and may be restarted for servicing the event. If no synchronizing event occurs before an event counter reaches its maximum value, and overflow of the event counter forces resynchronization. A cycle counter is provided for counting the number of clock cycles since the last processor event. The cycle counter is set to overflow and force resynchronization at a point before maximum interrupt latency time is exceeded.

2 Claims, 4 Drawing Sheets

U.S. PATENT DOCUMENTS

| | | | |
|---|---|---|---|
| 4,392,196 | 7/1983 | Glenn et al. | 364/200 |
| 4,392,199 | 7/1983 | Schmitter et al. | 364/200 |
| 4,399,504 | 8/1983 | Obermarck et al. | 364/200 |
| 4,402,045 | 8/1983 | Krol | 364/200 |
| 4,412,218 | 10/1983 | Niitsu | 340/825.56 |
| 4,412,281 | 10/1983 | Works | 364/200 |
| 4,414,624 | 11/1983 | Summer, Jr. et al. | 364/200 |
| 4,426,681 | 1/1984 | Bacot et al. | 364/200 |
| 4,430,707 | 2/1984 | Kim | 364/200 |
| 4,432,051 | 2/1984 | Bogaert et al. | 364/200 |
| 4,438,494 | 3/1984 | Budde et al. | 364/200 |
| 4,453,215 | 6/1984 | Reid | 364/200 |
| 4,455,605 | 6/1984 | Cormier et al. | 364/200 |
| 4,458,307 | 7/1984 | McAnlis et al. | 364/200 |
| 4,493,019 | 1/1985 | Kim et al. | 364/200 |
| 4,497,059 | 1/1985 | Smith | 371/36 |
| 4,541,094 | 9/1985 | Stiffler et al. | 371/68 |
| 4,564,903 | 1/1986 | Guyette et al. | 364/300 |
| 4,570,261 | 2/1986 | Maher | 371/16 |
| 4,577,272 | 3/1986 | Ballew et al. | 364/200 |
| 4,589,066 | 5/1986 | Lam et al. | 364/200 |
| 4,591,977 | 5/1986 | Hissen et al. | 364/200 |
| 4,597,084 | 6/1986 | Dynneson et al. | 371/51 |
| 4,607,365 | 8/1986 | Greig et al. | 371/8 |
| 4,616,312 | 10/1986 | Uebel | 364/200 |
| 4,633,394 | 12/1986 | Georgiou et al. | 364/200 |
| 4,638,427 | 1/1987 | Martin | 364/200 |
| 4,644,498 | 2/1987 | Bedard et al. | 364/900 |
| 4,646,231 | 2/1987 | Green et al. | 364/200 |
| 4,648,035 | 3/1987 | Fava et al. | 364/200 |
| 4,654,857 | 3/1987 | Samson et al. | 371/68 |
| 4,661,900 | 4/1987 | Chen et al. | 364/200 |
| 4,667,287 | 5/1987 | Allen et al. | 364/200 |
| 4,672,535 | 6/1987 | Katzman et al. | 364/200 |
| 4,683,570 | 7/1987 | Bedard et al. | 371/36 |
| 4,703,452 | 10/1987 | Abrant et al. | 364/900 |
| 4,709,325 | 11/1987 | Yajima | 364/200 |
| 4,733,353 | 3/1988 | Jaswa | 364/200 |
| 4,751,639 | 6/1988 | Corcoran et al. | 364/200 |
| 4,757,442 | 7/1988 | Sakata | 364/200 |
| 4,757,505 | 7/1988 | Marrington et al. | 371/66 |
| 4,763,333 | 8/1988 | Byrd | 371/66 |
| 4,774,709 | 9/1988 | Tulpule et al. | 371/11 |
| 4,779,008 | 10/1988 | Kessels | 307/269 |
| 4,783,731 | 11/1988 | Miyazaki et al. | 364/200 |
| 4,783,733 | 11/1988 | Greig et al. | 364/200 |
| 4,785,453 | 11/1988 | Chandran et al. | 371/68 |
| 4,794,601 | 12/1988 | Kikuchi | 371/36 |
| 4,799,140 | 1/1989 | Deitz et al. | 364/140 |
| 4,800,462 | 1/1989 | Zacher et al. | 361/413 |
| 4,805,107 | 2/1989 | Kieckhafer et al. | 364/200 |
| 4,819,159 | 4/1989 | Shipley et al. | 364/200 |
| 4,823,256 | 4/1989 | Bishop et al. | 364/200 |
| 4,827,401 | 5/1989 | Hrustich et al. | 364/200 |
| 4,831,520 | 5/1989 | Rubinfeld et al. | 364/200 |
| 4,845,419 | 7/1989 | Hacker | 320/39 |
| 4,847,837 | 7/1989 | Morales et al. | 371/8 |
| 4,849,979 | 7/1989 | Maccianti et al. | 371/68 |
| 4,853,872 | 8/1989 | Shimoi | 364/300 |
| 4,868,818 | 9/1989 | Madan et al. | 371/11.3 |
| 4,868,826 | 9/1989 | Smith et al. | 371/9.1 |
| 4,868,832 | 9/1989 | Marrington et al. | 371/66 |
| 4,873,685 | 10/1989 | Millis, Jr. | 371/3 |
| 4,879,716 | 11/1989 | McNally et al. | 371/8.2 |
| 4,907,232 | 3/1990 | Harper | 371/36 |
| 4,912,698 | 3/1990 | Bitzinger et al. | 370/13 |
| 4,914,657 | 4/1990 | Walter et al. | 364/200 |
| 4,933,940 | 6/1990 | Walter et al. | 371/9.1 |
| 4,959,774 | 9/1990 | Davis | 364/200 |
| 4,965,717 | 10/1990 | Cutts, Jr. et al. | 364/200 |
| 5,018,148 | 5/1991 | Patel et al. | 371/66 |
| 5,020,059 | 5/1991 | Gorin et al. | 371/11.3 |

FOREIGN PATENT DOCUMENTS

| | | |
|---|---|---|
| 0286856 | 3/1988 | European Pat. Off. |
| 0316087 | 3/1990 | European Pat. Off. |
| PCT/US84/-02011 | 12/1984 | PCT Int'l Appl. |
| WO8502698 | 12/1984 | PCT Int'l Appl. |

OTHER PUBLICATIONS

"Comparative Architecture of High-Availability Computer Systems" by McCluskey & Ogus; Inst. of Electrical & Electronics Engineers, Spring Conf. 14: 1977.

"Architectural Description of a Fault-Tolerant Multiprocessor Engineering Prototype" by Smith and Hopkins; 8th Ann. Int'l Conf. on Fault-Tolerant Computing Jun. 1978.

D. Nadel, "Closely coupled asynchronous hierarchical and parallel processing in an open architecture," The 12th Annual International Symposium on Computer Architecture, Conference Proceedings, Boston, Mass., Jun. 17-19, 1985 pp. 215-220.

(List continued on next page.)

OTHER PUBLICATIONS

Hopkins, Jr., "A Fault-Tolerant Information Processing Concept for Space Vehicles", IEEE Trans. on Computers, Nov. 1971, pp. 1394–1403.

Skarloff, "Redundancy Management Technique for Space Shuttle Computers", IBM J. of Res. Develop., Jan. 1976, pp. 20–28.

Kilmer et al., "Comparison of Synchronization Techniques for Redundant Computer Sets", Report by IBM Fed. Sys. Div., dated Mar. 22, 1974, pp. 1–6.

Philip H. Enslow, Jr., "Multiprocessors and Parallel Processing", Pub. by John Wiley & Sons; 1974; pp. 28–33.

Product Brochure, "Tolerant Systems 'Eternity ® Series' Computer Systems"; Jan., 1984 6 pages.

"Computer System Isolates Faults", Computer Design, Nov. 1983, 7 pages (reprint).

Product Brochure, "NCR 9800 System —Technical Overview"; Copyright 1986, 44 pages.

Product Brochure, "Biin 60 ® System —Technical Overview", dated 1988; 23 pages.

E. I. Cohen et al. "Storage Hierarchies", 1989, IBM Systems Journal, vol. 28, No. 1, pp. 62–76.

S. Chang, "Multiple-Read Single Write Memory and its Applications", IEEE Transactions on Computers, Aug., 1990, pp. 689–694.

"Implementation of Interrupt Handler for Loosely–Synchronized TMR Systems," By Tomohiro Yoneda, et al., 1985 IEEE, pp. 246–251.

"Interactive Consistency and its Impact on the Design of TMR Systems," by Steven G. Frison, et al., 1982 IEEE, pp. 228–233.

"SIFT: System Design and Implementation," by Charles B. Weinstock, 1980 IEEE, pp. 75–77.

"Synchronizing and Voting," by Stephen R. McConnel, et al., IEEE Transactions on Computers, vol. C-30, No. 2, Feb., 1981, pp. 161–164.

"Synchronization and Matching in Redundant Systems," by Daniel Davies, et al., IEEE Transactions on Computers, vol. C-27, No. 6, Jun., 1978, pp. 531–539.

"High Performance Fault Tolerant Real Time Computer Architecture," by T. Basil Smith, 1986 IEEE, pp. 14–19.

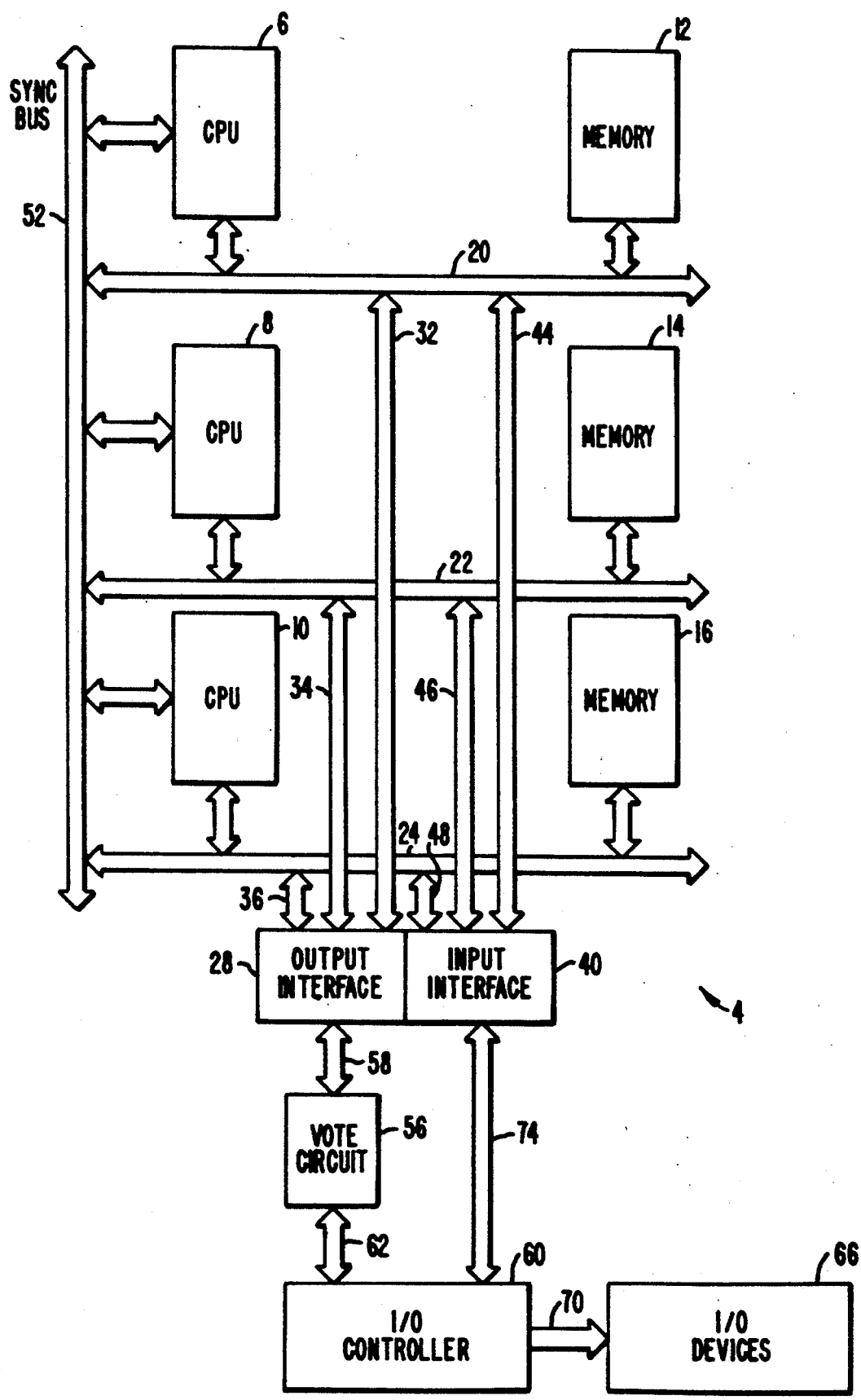
FIG._1.

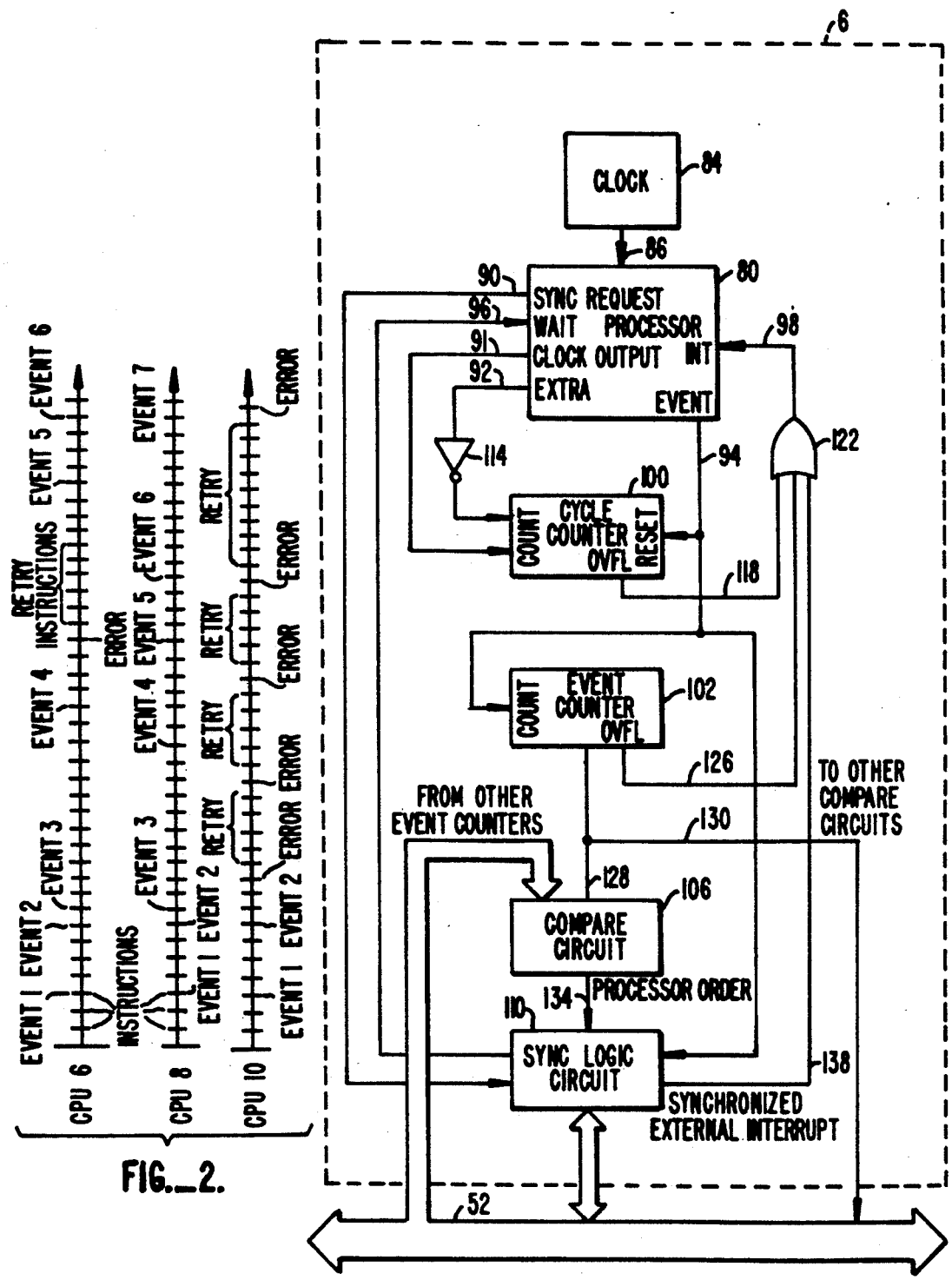
FIG._2.
FIG._3.

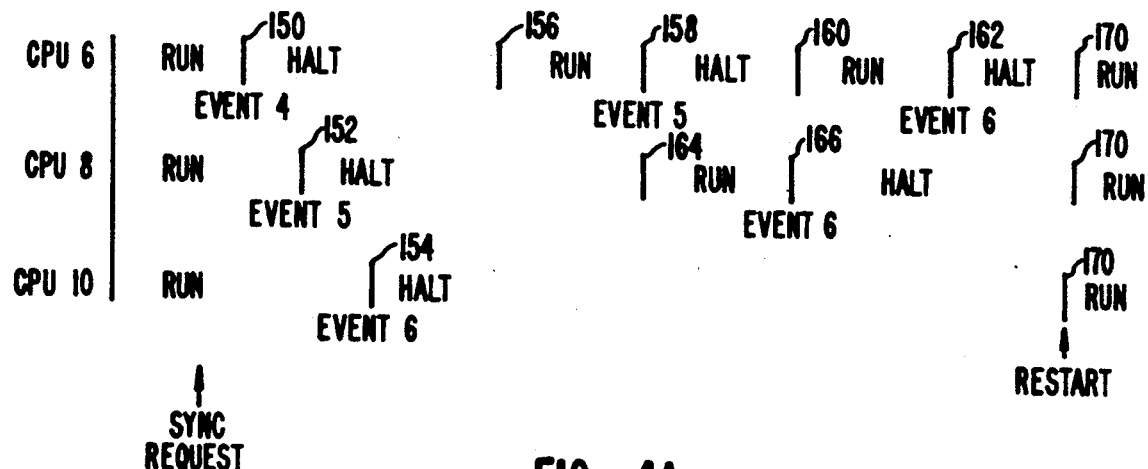
FIG._4A.
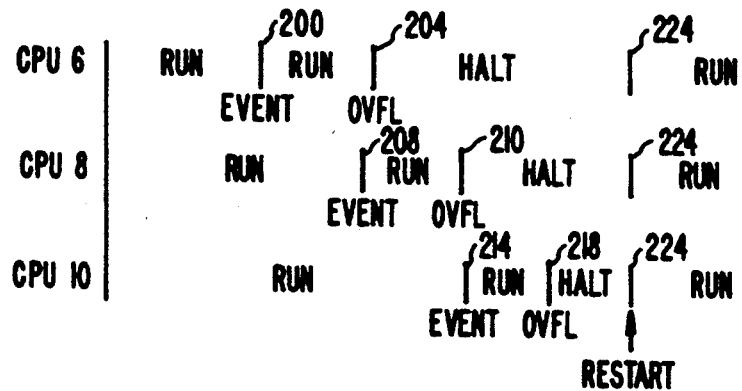
FIG._4B.
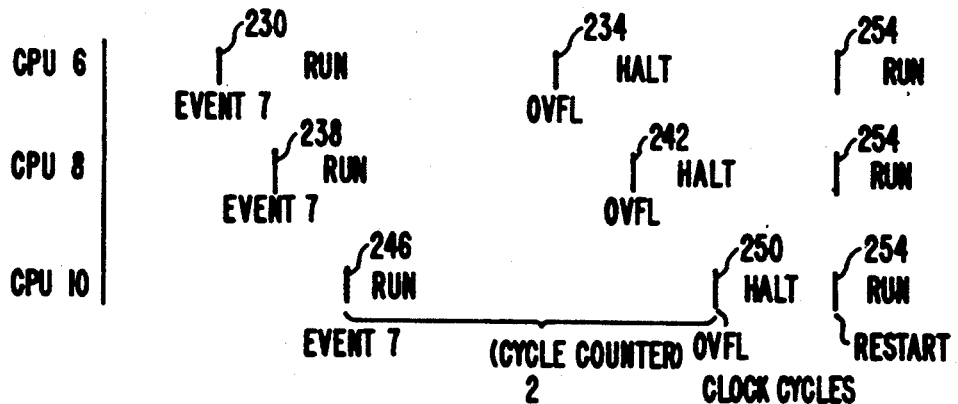
FIG._4C.

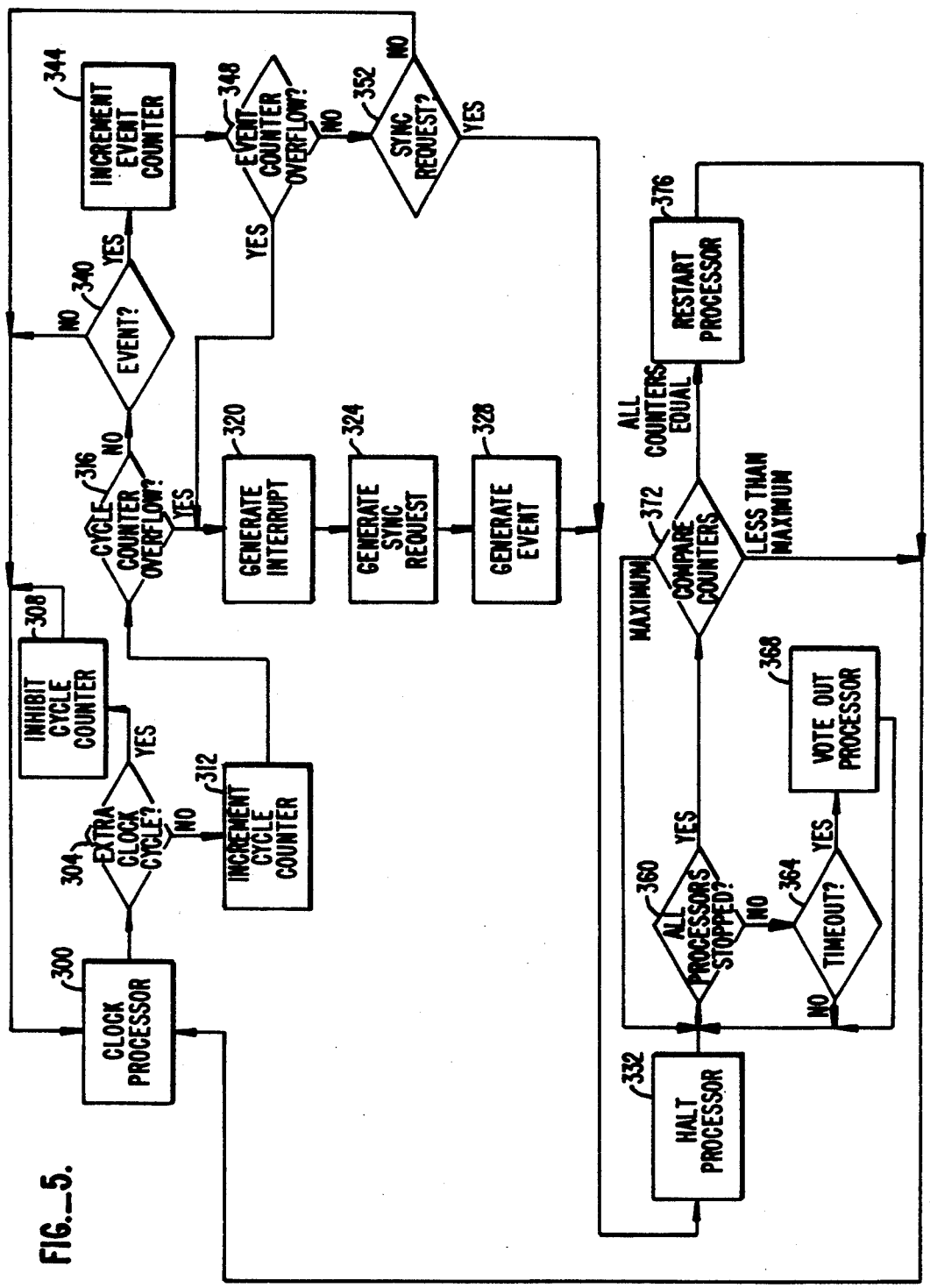
FIG._5.

METHOD AND APPARATUS FOR SYNCHRONIZING A PLURALITY OF PROCESSORS

RELATED APPLICATIONS

This is a continuation of co-pending application Ser. No. 07/118,503 filed on Nov. 09, 1987 now abandoned.

BACKGROUND OF THE INVENTION

1. Field of the Invention

This invention relates to data processing systems and, more particularly, to a method and apparatus for synchronizing multiple processors to ensure data integrity or to provide fault tolerance.

2. Description of the Relevant Art

As the use of microprocessors becomes more prevalent, the need to ensure data integrity and to provide for tolerance of hardware or other faults within the system has become more critical. One method of ensuring data integrity is to provide two processors which execute the same program and which compare the results to detect errors. Once an error is detected, appropriate error routines may be invoked. Methods for providing fault tolerance include having three or more processors which execute the same program and which use a majority vote of the results in order to tolerate one or more malfunctioning processors. Alternatively, two pairs of processors may be configured so that, if an error in one pair is detected, that pair is disabled and processing continues in the other pair. In all of the foregoing configurations, the processors must be synchronized to allow results to be compared or voted.

Known systems which ensure data integrity and provide fault tolerance may be divided roughly into four categories: 1) lock step systems which use non-fault tolerant clocks; 2) lock step systems which use fault tolerant clocks; 3) systems which vote bus interface signals; and 4) systems which implement synchronization and voting through software. An example of a lock step processor without fault tolerant clocking is given in U.S. Pat. No. 4,453 215 issued Jun. 5, 1984, to Robert Reid. This patent discloses a multiple processing system using a single non-fault-tolerant clock, and the lock stepped processors must have identical bus cycle timing in order to avoid a miscompare error. The system clock thus is a single element which can effect failure of the entire system. Additionally, some processors require a very high frequency clock source, and each clock source must be synchronized, typically within one-half of a clock period. This is difficult, if not impossible, to accomplish with high-frequency clocks. Furthermore, there are restrictions on the type of processor which may be used in such systems due to the strict nature of the lock stepping. Some processors have cache memories on the processor chip, and the memories may have memory locations which are inaccessible as a result of manufacturing defects. These defects cause individualized cache misses and retries which, in turn, cause the processors to get out of step. Finally, in some processors there is no way to deterministically initialize the entire internal state.

An example of a lock step system which uses fault tolerant clocking is disclosed in Smith T. Basil, "High Performance Fault Tolerant Real Time Computer Architecture," *PROC 16th Annual Symposium on Fault Tolerant Computing*, pp. 14–19, July, 1986. This system alleviates some of the problems of lock step systems without fault tolerant clocks by generating multiple low speed clocks using a fault tolerant clocking circuit. The fault tolerant clocking circuit is independent of the processor clock. The disadvantages of this scheme is that each processor may have different clock speeds but only one I/O clock speed, and the slowest I/O clock does not readily scale to faster processors. As a result, all I/O must be synchronized to the slow clock. This causes the I/O performance to be severely degraded. Finally, the fault tolerant clock is difficult to prove correct because voting of the clock signals is done using an analog system with feedback, and thus Boolean equations cannot be used to verify its operation.

Synchronization schemes in which bus interface signals are voted are presented in Davies, D. and Wakerly, J., "Synchronization and Matching in Redundant Systems," *IEEE Transactions on Computers*, pp. 531–539, June, 1978, and McConnel, S. and Siewiorek, D., "Synchronization and Voting," *IEEE Transactions on Computers*, pp. 161–164, February, 1981. These papers suggest systems which run off of independent clocks and which use voting of interface signals for synchronization. For example, a plurality of processors may be connected to a corresponding plurality of memories. When a processor makes a request to its associated memory, the memory waits until it detects a request from at least one other processor to its associated memory before it acknowledges its own received request. Similarly, the processors will not recognize the memory acknowledgements until acknowledgements from at least two memories are received. While this method avoids the need for fault tolerant clocks, and it may possibly tolerate "extra" clock cycles (as a result of error retries, variations in cache hit rates, asynchronous logic, etc.), it has drawbacks. For example, the waiting requirement adversely affects the timing of many speed-critical bus interface signals. This may have an enormous impact on performance. Additionally, neither paper addresses the difficult problem of synchronizing unsolicited external interrupts. If the processors sample at different times, one may detect the interrupt signal and others may not.

Systems in which synchronization and voting are both implemented through software include software implemented fault tolerance (SIFT), disclosed in Weinstock, Charles B., "SIFT: Design in Implementation," *PROC. 10th Annual Symposium on Fault Tolerant Computing*, pp. 75–77, October, 1980, the August Systems Series 300 disclosed in Frison, S. G. and Wensley, John H., "Interactive Consistency and Its Impact On the Design of TMR Systems," *PROC. 12th Annual Symposium on Fault Tolerant Computing*, pp. 228–233, June, 1982, and an experimental system disclosed in Yoneda, T., et al., "Implementation of Interrupt Handler for Loosely Synchronized TMR Systems," *PROC. 15th Annual Symposium on Fault Tolerant Computing*, pp. 246–251, June, 1985. These systems use independent clocks, and hence they can tolerate "extra" clock cycles. However, they require an extra layer of software which performs voting and synchronization by exchanging messages between the processors. Standard systems software may not be used. Instead, complex software is required to assure that all processors respond identically to interrupts, and this extra software severely degrades performance of the system.

SUMMARY OF THE INVENTION

The present invention is directed to a method and apparatus for loosely synchronizing a plurality of processors. The apparatus according to the invention allows two or more processors to be configured in a fault detecting or fault tolerant arrangement without the need for a fault tolerant clock circuit. The processors are free to execute the same algorithm at different speeds, whether due to differences in clock rates or the occurrence of "extra" clock cycles. "Extra" clock cycles may occur because of error retries, variations in cache hit rates, or as a result of asynchronous logic, and they represent clock cycles which ordinarily do not occur when executing a particular program. External interrupts are synchronized in a manner such that each processor responds to the interrupt at the same point in its execution with due regard for maximum interrupt latency time.

In one embodiment of the present invention, each processor runs off of its own independent clock. The processor indicates the occurrence of a prescribed processor event on one line and receives signals on another line for initiating a wait state. A processor event may be defined either explicitly or implicitly by the code running in the processor, and it is preferable to generate one processor event signal for each microprocessor write operation. Each processor has a counter, termed an event counter, which counts the number of processor events indicated since the last time the processors were synchronized.

The processors typically are synchronized whenever an external interrupt occurs, although the system designer is free to define any synchronizing event. When an event requiring synchronization is detected by a sync logic circuit associated with the processor, the sync logic circuit generates a wait signal after the next processor event. A compare circuit associated with each processor tests the other event counters in the system and determines whether its associated processor is behind the others. If so, the sync logic circuit removes the wait signal until the next processor event. The compare circuit then rechecks to see if its associated processor is still behind. The processor is finally stopped when its event counter matches the event counter for the fastest processor. The process continues until all processors are stopped with each event counter having the same value. When this point is reached, the processors are then all stopped at the same point in the program. The wait signal is removed, the interrupt line to each processor is asserted, and all processors are restarted to handle the synchronizing event.

If no synchronizing event occurs before an event counter reaches its maximum value, an overflow of the event counter forces resynchronization. The affected processor waits until the other processors event counters also overflow before continuing. On the other hand, if a synchronizing event occurs but the processor events do not occur often enough to satisfy worst-case interrupt latency times, another counter, termed a cycle counter, is provided for counting the number of clock cycles since the last processor event. The cycle counter is set to overflow at a point before maximum interrupt latency time is exceeded. An overflow of the cycle counter forces resynchronization by generating an internal synchronization request signal and an interrupt signal. When the processor services the interrupt, the code within the interrupt routine forces an event to be generated. The internally generated synchronization request signal thus causes resynchronization to the event generated by the interrupt routine. The processors then may serve the pending interrupt.

These and other advantages of the invention will become apparent to those skilled in the art upon reading the following detailed description of the invention, which should be taken in conjunction with the accompanying drawings.

BRIEF DESCRIPTION OF THE DRAWINGS

FIG. 1 is a conceptual block diagram of an embodiment of a data processing system according to the present invention.

FIG. 2 is a diagram of a processing sequence of the data processing system illustrated in FIG. 1.

FIG. 3 is a conceptual block diagram of an embodiment of a CPU illustrated in FIG. 1.

FIG. 4A–4C are diagrams illustrating processor synchronizing procedures according to the present invention.

FIG. 5 is a flow chart illustrating processor synchronization according to the present invention.

DETAILED DESCRIPTION OF THE PREFERRED EMBODIMENTS

FIG. 1 is a block diagram of a data processing system 4 according to the present invention. As shown therein, data processing system 4 comprises a CPU 6, a CPU 8, and a CPU 10 which communicate with a memory 12, a memory 14, and a memory 16 through a CPU-memory bus 20, a CPU-memory bus 22, and a CPU-memory bus 24, respectively. CPU 6, CPU 8, and CPU 10 communicate data to an output interface 28 through buses 32, 34, and 36, respectively, and they receive data from an input interface 40 through buses 44, 46, and 48 respectively. CPU 6, CPU 8, and CPU 10 communicate with each other and to output interface 28 and input interface 40 through a sync bus 52. Output interface 28 communicates data from CPU 6, CPU 8 and CPU 10 to a vote circuit 56 over an interface-vote bus 58. Vote circuit 56 determines the data from which processor should be communicated to an I/O controller 60. Data is communicated to I/O controller 60 and ultimately to an I/O device 66 over a vote-controller Bus 62 and a controller-device bus 70, respectively. Data is communicated from I/O controller 60 to input interface 40 through an interface-controller bus 74.

As shown in FIG. 2. CPU 6, CPU 8, and CPU 10 execute a number of instructions, some of which have processor events associated with them. A processor event is defined either explicitly or implicitly by the code running in the processors. For example, each microprocessor write operation may be considered a processor event. Other possibilities for a processor event may be data reads, bus transfers, or specific signals generated by explicit code in the processor. In any case, events occur in the same order in each processor. However, events may not occur at the same time in each processor. For example, one processor may be executing a revised version of the code executing in another processor, and the revised code may contain extra instructions which cause the events to occur at different times. Notice event 4 in CPU 6 and CPU 8. Another reason events may not occur at the same time, even in programs executing identical code, is the occurrence of unexpected errors such as cache misses which necessitate read retries or the detection of parity errors in which case execution may branch to an error routine. Notice the errors encountered by CPU 6 and 10.

Because a system according to the present invention encounters the plurality of processor events in the same order, the processors may be synchronized by synchronizing each microprocessor to a prescribed event. The structure which allows each processor to be so synchronized is illustrated for CPU 6 in FIG. 3. CPU 8 and CPU 10 are constructed the same way. As shown in FIG. 3, CPU 6 comprises a processor 80 which executes instructions based on clock pulses received from its own clock 84 over a line 86. Processor 80 generates an internal sync request signal on a line 90, a clock output signal on a line 91, an "extra" clock signal on a line 92, and a processor event signal on a line 94. "Extra" clock cycles may occur because of error retries, variations in cache hit rates, asynchronous logic or for other reasons. They represent clock cycles which ordinarily do not occur when executing a particular program. Processor 80 receives a wait signal on a line 96 and an interrupt signal on a line 98.

CPU 6 further includes a cycle counter 100 for counting clock cycles, an event counter 102 for counting processor events, a compare circuit 106 for comparing the value of event counter 102 with the other event counters within the system, and a sync logic circuit 110 for controlling the synchronization of CPU 6. Cycle counter 100 is connected to line 91 for counting the number of clock cycles occurring since the last processor event. Cycle counter 100 is connected to line 92 through an inverter 114 for inhibiting clock cycle counting when extra clock cycles occur. The reason for this is discussed below. Cycle counter 100 also is connected to line 94 for being reset upon each processor event. Whenever cycle counter 100 overflows, it generates an interrupt signal on a line 118 which, in turn, is connected to an OR gate 122. The output of OR gate 122 is connected to line 98. It is understood that OR gate 122 is a conceptual OR gate. Actual interrupt processing is performed using well known techniques.

Event counter 102 is connected to line 94 for counting events detected by processor 80. As with cycle counter 100, whenever event counter 102 overflows it generates an interrupt signal to OR gate 122 on a line 126. The value of event counter 102 is communicated to compare circuit 106 over a line 128 and to sync bus 52 over line 130. Compare circuit 106 receives the number of events counted by event counter 102 over line 130 and the number of events counted by the event counters for the other processors within the system from sync bus 52. Compare circuit 106 generates a signal to sync logic circuit 110 over a line 134 indicating the relationship between the value from event counter 102 and the values from the other event counters in the system.

Sync logic circuit 110 controls the operation of processor 80 by asserting or removing a wait signal on line 96 in response to events indicated on line 94. When the processors are synchronized, sync logic circuit 110 generates synchronized external interrupt signals on line 138.

Operation of the system may be understood by referring to FIGS. 4A-4C and 5.

FIG. 4A illustrates a situation where a sync request (e.g., external interrupt) is received by CPUs 6, 8 and 10, but where CPUs 6, 8 and 10 are executing different portions of code. In this case, CPU 6 executes code until event 4 is indicated in time at a point 150. When event 4 is detected, sync logic circuit 110 causes CPU 6 to enter a wait state. Similarly, CPU 8 continues running until event 5 is detected at a point 152 whereupon CPU 8 enters a wait state. CPU 10 executes code until event 6 is detected at a point 154 whereupon CPU 10 enters a wait state. Since the number of events counted by CPU 6 is less than the number of events counted by CPU 10, CPU 6 resumes instruction execution at a point 156 until event 5 is detected at a point 158 whereupon CPU 6 again enters a wait state. When it is ascertained that CPU 6 still is behind CPU 10, instruction execution resumes at a point 160 until event 6 is detected at a point 162 whereupon CPU 6 again enters a wait state. CPU 8 undergoes a similar processing sequence. That is, when it is ascertained that the number of events counted for CPU 8 is less than the maximum number of events counted by any of the three processors, CPU 8 resumes instruction execution at a point 164 until the next event is detected at point 166 whereupon CPU 8 enters a wait state, and so on. Since CPU 10 counted the most events before the sync request was received, CPU 10 remains in a wait state until the event counters for each of CPU 6, 8 and 10 are equal. When this occurs, the sync logic circuit 110 associated with each processor issues a synchronized external interrupt signal on line 138, releases the wait signal on line 96 and execution for each processor resumes at a common point 170.

FIG. 4B illustrates a processing sequence wherein CPUs 6, 8 and 10 are synchronized as a result of an event counter overflow. As shown therein, CPU 6 executes code, and an event occurs at a point 200. Code execution resumes until the event counter for CPU 6 overflows at a point 204. At this point, event counter 102 in CPU 6 issues an interrupt signal on line 126, and CPU 6 enters a wait state. The same sequence of events and event counter overflows occur for CPUs 8 and 10 at points 208, 210 and at points 214, 218 respectively. When it is ascertained that each CPU 6, 8 and 10 is in a wait state, sync logic circuit 110 for each processor removes the signal from line 96, and code execution resumes at common points 224.

FIG. 4C illustrates a situation where synchronization occurs as a result of a cycle counter overflow. As shown therein, CPU 6 detects event 7 at a point 230, and code execution continues for 2**(cycle counter) clock cycles until its cycle counter 100 overflows at a point 234. Cycle counter 100 issues an interrupt signal on line 118, and CPU 6 enters a wait state. Similarly, CPU 8 detects event 7 at a point 238 and continues code execution until its cycle counter overflows at a point 242 whereupon CPU 8 enters a wait state. Finally, CPU 10 detects event 7 at a point 246 and continues code execution until its cycle counter 100 overflows at a point 250 whereupon CPU 10 enters a wait state. When it is ascertained that each processor is in a wait state, sync logic circuit 110 removes the signal from line 96, and code execution resumes at common points 254.

FIG. 5 illustrates the processing sequence for each CPU 6, 8 and 10. As shown therein, each processor is clocked for executing instructions in a step 300. If it is ascertained in a step 304 that the present clock cycle is an extra clock cycle, then cycle counter 100 is inhibited in a step 308, and processing resumes in step 300. If it is ascertained in step 304 that the present clock cycle is not an extra clock cycle, then cycle counter 100 is incremented in a step 312. It is then ascertained in a step 316 whether cycle counter 100 has overflowed. If so, then cycle counter 100 interrupts its respective processor in a step 320 and generates a sync request in step 324. In response to the interrupt generated by cycle counter 100, the processor generates an event in a step 328 whereupon the processor enters a wait state in a step 332 (as a result of the sync request signal generated in step 324).

In the case of a cycle counter overflow, all processors reach the processor event in the interrupt code exactly 2(cycle counter) clock cycles after the last processor event. The processors will be in sync as long as no extra clock cycles occurred during the 2(cycle counter) clock cycles before the cycle counter overflows. If extra clocks did occur, the processors would stop at different points, possibly causing a mismatch, and the processors may respond differently to the interrupts, thus resulting in a processor or system failure. That is why each cycle counter is disabled during every extra clock cycle.

If it is ascertained in 316 that cycle counter 100 did not overflow, it is then ascertained in a step 340 whether an event has occurred. If not, processing resumes in step 300. If an event has occurred, then event counter 102 is incremented in a step 344. It is then ascertained in a step 348 whether event counter 102 has overflowed. If so, then the processor is interrupted in step 320 and processing continues as with a cycle counter overflow until the processor is halted in step 332. If it is ascertained in step 348 that event counter 102 has not overflowed, then it is ascertained in a step 352 whether a sync request is outstanding. If so, then processor is halted in step 332; otherwise code execution continues in step 300.

After the processor is stopped in step 332, it is then ascertained in a step 360 whether all processors have stopped. If not, then it is ascertained in a step 364 whether the maximum amount of time allowed for processor synchronization has been exceeded. This may occur, for example, upon a processor failure. If the maximum time has been exceeded, then the processor is voted out, i.e., disregarded in the comparison process, in a step 368. In any event, comparison continues among the properly functioning processors in step 360. Once all processors have stopped, the counters are compared in a step 372. If it is ascertained that the counter for a particular processor is greater than another processor, then the processor(s) having the greater count remain(s) in a wait state and processing continues in step 360. On the other hand, if the value of the counter for a particular processor is less than the maximum count value, then processing reverts to step 300 wherein execution resumes until the next event is detected, the processor stopped, and the counters are again compared. If it is ascertained in step 372 that all counters are equal, then the wait signals are removed from each processor, and the processors are restarted in a step 376 for servicing the sync request.

While the above is a complete description of a preferred embodiment of the present invention, various modifications may be employed. For example, sync logic circuit 110 may be integrated into a single circuit connected to each chip, and the system may be used with any number of processors. Consequently, the scope of the invention should not be limited except as properly described in the claims.

I claim:

1. Apparatus for synchronizing a plurality of processors, each of which processes during clock cycles according to a program in leading or trailing relationship to the processing during clock cycles of another processor according to the program, comprising for each processor:

event indicating means for indicating the occurrence of a prescribed event within the processor;

event counting means connected to the event indicating means, for counting the number of events indicated, said event counting means providing a sync request signal to the processor when the number of events counted equals a prescribed value;

comparison means connected for receiving signals from the event counting means for each processor, for providing a signal when the number of events counted for the processor is greater than the number of events counted for another processor;

cycle counter means for counting a number of clock cycles occurring after an event;

means for providing a synchronizing request signal to the processor when the number of clock cycles counted equals a prescribed value;

extra clock indicating means for indicating when the processor uses extra clock cycles to execute a program;

sync request input means for receiving a synchronization request signal; and synchronization means, connected to the sync request input means and to the event counting means for suspending processing of the processor in response to a synchronization request signal when the number of events counted for the processor is not less than the number of events counted for another processor, said synchronization means providing a restart signal to the processor when the number of events counted for each processor is equal.

2. The apparatus according to claim 1 wherein the cycle counter means further includes disable means, connected to the extra clock indicating means, for inhibiting the counting of clock cycles when the processor uses extra clock cycles to execute a program.

* * * * *